United States Patent [19]

Dias et al.

[11] 3,886,484

[45] May 27, 1975

[54] ACOUSTIC SURFACE WAVE DEVICES HAVING IMPROVED PERFORMANCE VERSUS TEMPERATURE CHARACTERISTICS

[75] Inventors: J. Fleming Dias; Henry E. Karrer, both of Palo Alto, Calif.

[73] Assignee: Hewlett-Packard Company, Palo Alto, Calif.

[22] Filed: June 24, 1974

[21] Appl. No.: 482,050

[52] U.S. Cl. ............... 331/107 A; 310/9.6; 330/5.5; 333/30 R; 333/72

[51] Int. Cl. ............................................ H03b 5/32

[58] Field of Search ............. 310/9.6; 333/30 R, 72; 330/5.5; 331/107 A

[56] References Cited

UNITED STATES PATENTS

| | | | |
|---|---|---|---|
| 3,781,721 | 12/1973 | Judd et al. | 333/30 R |
| 3,815,056 | 6/1974 | Meyer et al. | 333/30 R |
| 3,831,116 | 8/1974 | Davis et al. | 331/107 A |

*Primary Examiner*—John Kominski
*Attorney, Agent, or Firm*—F. David LaRiviere

[57] ABSTRACT

More than one piezoelectric substrate or a single multifaceted piezoelectric substrate, each facet or substrate having interdigital transducers deposited thereon and coupled in cascade, comprise the acoustic surface wave device described herein which provides stable performance characteristics over broad temperature ranges.

4 Claims, 10 Drawing Figures

CONVENTIONAL

PRESENT INVENTION

ACOUSTIC SURFACE WAVE DEVICES HAVING IMPROVED PERFORMANCE VERSUS TEMPERATURE CHARACTERISTICS

BACKGROUND OF THE INVENTION

The first application for acoustic surface wave (ASW) devices was in delay-lines. In addition they have been considered for use as frequency filters and other applications in signal processing systems. Recently much interest has been shown in acoustic surface-wave oscillators comprising an ASW delay-line connected in a feedback loop of an amplifier.

The stability of an ASW device, such as an oscillator, depends on several factors including the design of the interdigital (ID) transducer pair, the distance between each ID transducer of the pair and the ambient temperature in which the device is operating. To oscillate, the phase shift around the loop must be equal to $2N\pi$ and the loop gain must be unity. Such a device is fully described in co-pending U.S. patent application Ser. No. 404,829 entitled "Acoustic Surface Wave Apparatus" filed by Henry E. Karrer and J. Fleming Dias and is hereby incorporated by reference as if fully set forth herein.

Using the configuration of FIG. 1*a*, FIG. 1*b* shows the effect of temperature on the oscillator frequency. Rotated Y-cuts of quartz give a parabolic shape to its temperature versus phase shift characteristic curve (phase shift is directly related to ASW oscillator frequency). In this configuration the effect of temperature on the oscillator frequency is minimal at the turnover which is, therefore, the most desirable operating point on the curve. One of the problems with this arrangement is that the temperature range is limited by the very nature of the parabolic frequency versus temperature characteristic. One solution is to use a temperature controlled oven and operate within a narrow temperature range. The present invention solves this problem by synthesizing special cuts of the piezoelectric substrate which effectively broadens the temperature range in which stable operation is preserved.

SUMMARY OF THE INVENTION

By operating two delay-line substrates made from different rotated Y-cut substrates in cascade, stable operation over a broader temperature range is achieved. FIG. 2 shows graphically the resultant broader temperature range. Curves I and II represent two temperature frequency curves, corresponding to rotated Y-cuts, $\theta_1$ and $\theta_2$ respectively. If these substrates are cascaded, the total delay or phase shift will be the sum of the two. Hence, wherever the slopes are equal but opposite in sign, the time delay or phase shift remains constant. Now around the turnover regions, the delay of one delay line is changing slowly, whereas the delay of the other one in this turnover region is changing rapidly. The same behavior is evident around the other turnover. Thus, the sum characteristic has substantially flat top and reasonably sharp skirts as shown by curve III in FIG. 2. Therefore, by cascading two or more substrates having rotated Y-cuts, stable performance over broader temperature range is achieved.

One object of the present invention is to provide an ASW device having stable operating characteristics over a wider temperature range.

Another object of this invention is to provide an ASW oscillator in which the frequency of oscillation is less susceptible to loop phase fluctuations.

DESCRIPTION OF THE PREFERRED EMBODIMENT

Figure 1A:
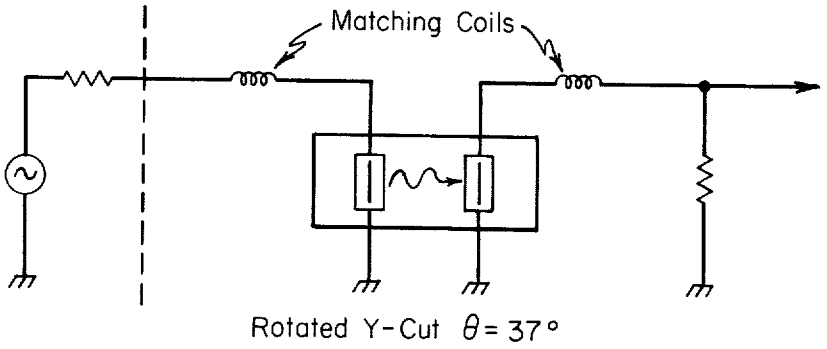
FIG. 1*a* is a circuit for determining phase-shift versus temperature characteristic of a rotated Y-cut substrate.
Figure 2:
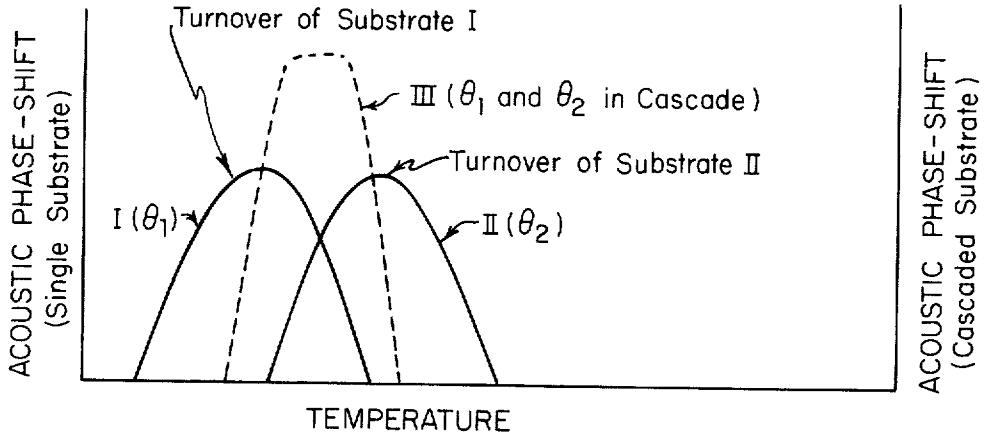
FIG. 2 is a graph of an extended-range phase-shift versus temperature characteristic according to the present invention.
Figure 3A:
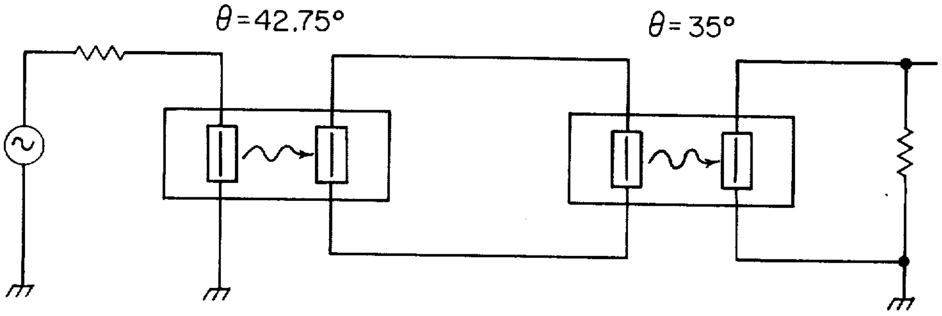
FIG. 3*a* is a circuit for determining the phase-shift versus temperature characteristic of one embodiment of the present invention.
Figure 1B:
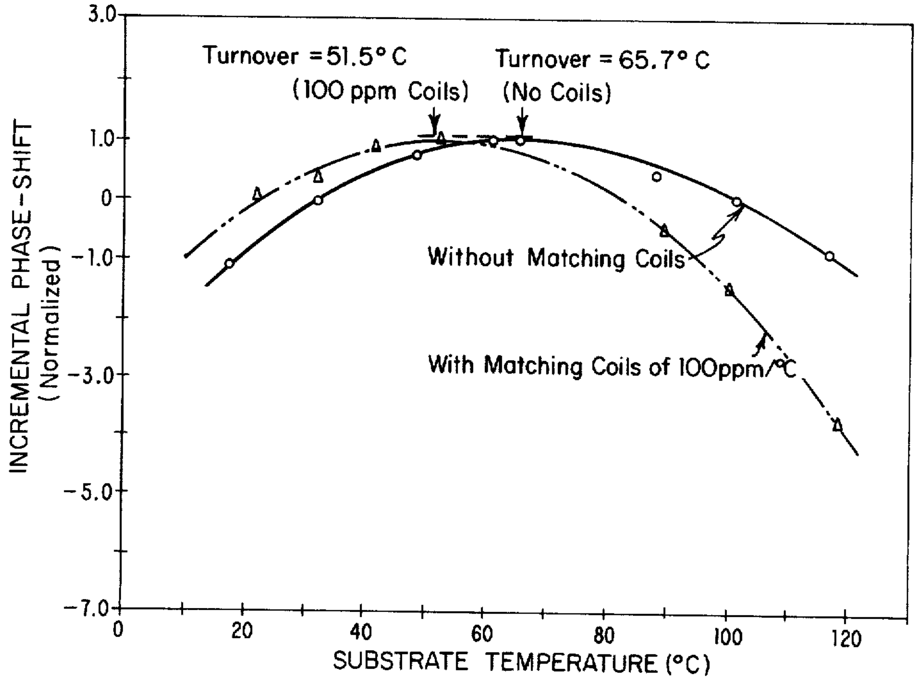
FIG. 1*b* is a graph of phase-shift versus temperature characteristics for prior art single rotated Y-cut substrates with and without matching coils.
Figure 3B:
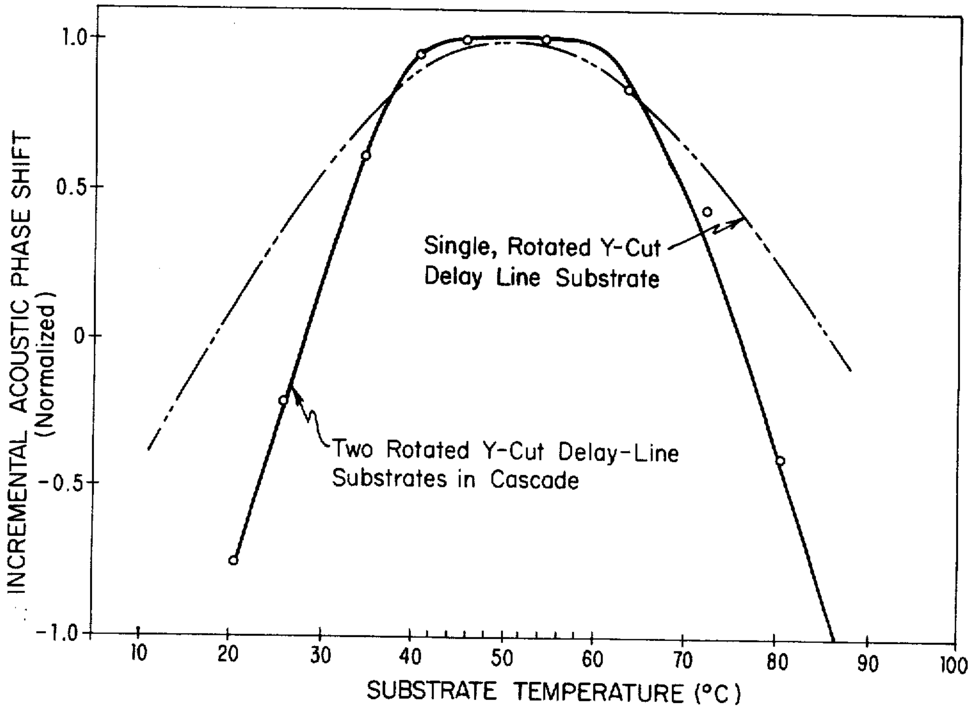
FIG. 3*b* is a graph of the extended-range phase-shift versus temperature characteristic of one embodiment of FIG. 3*a*.

Referring to FIG. 3*a*, a substrate having a rotated Y-cut of $\theta_1 = 42.75$ is cascaded with a second substrate having a rotated Y-cut of $\theta_2 = 35°$. The total phase shift through the delay line is measured as a function of temperature. The $\theta_1$ substrate has one phase shift versus ambient temperature characteristic and the $\theta_2$ substrate has another such characteristic. The total phase shift versus ambient temperature characteristic is the combination of the $\theta_1$ and $\theta_2$ characteristics. A response curve of the resultant combination is shown in FIG. 3*b*, clearly demonstrating the broader range of stable operation. If these delay lines were introduced in the feedback loop of a high gain amplifier, an ASW oscillator having stable frequency of oscillation over a wider temperature range would result. By using more than two substrates and by a careful selection of the rotated Y-cut, the operating temperature range can be further widened.

Figure 4A:
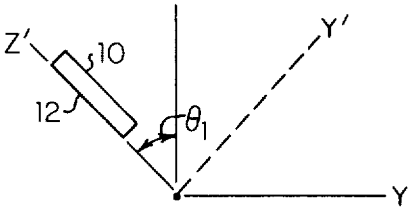
FIG. 4*a* is a sectional view of the crystallographic orientation of conventional substrate.
Figure 4B:
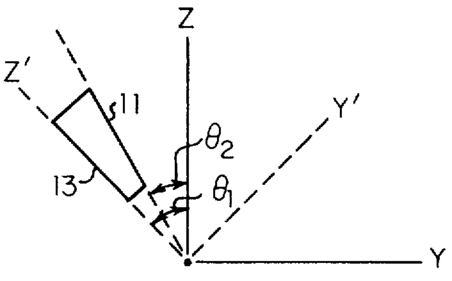
FIG. 4*b* is a sectional view of the crystallographic orientation of a substrate prepared according to the present invention.
Figure 5:
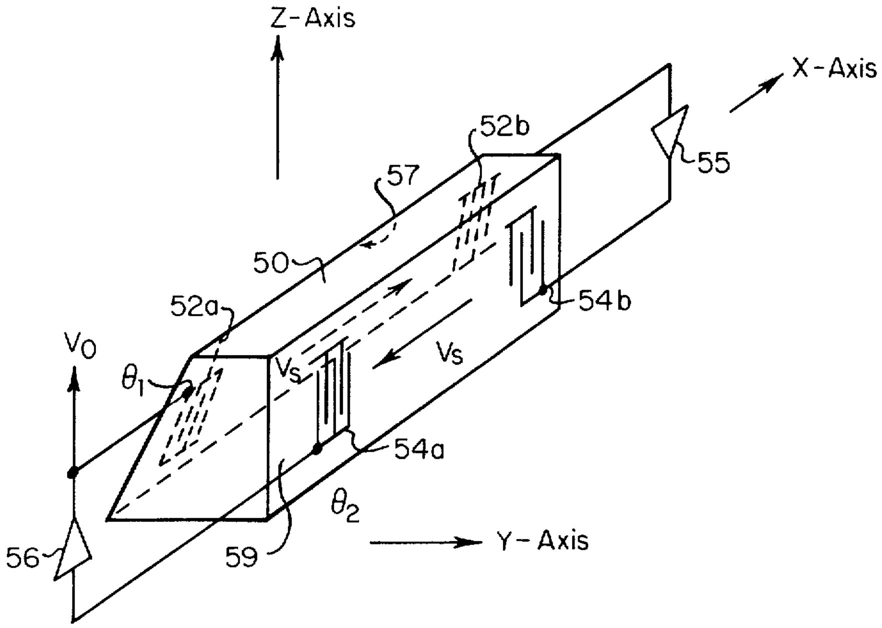
FIG. 5 is one embodiment of the present invention.

There are several embodiments of this invention including a monolithic device which combines the discrete delay lines shown in FIG. 3 described above. FIG. 4*a* is a sectional view of a conventional, rotated-quartz substrate showing the crystallographic orientation thereof. Faces 10 and 12 of this substrate are substantially parallel. FIG. 4*b* is a similar view of a single monolithic piece of quartz which achieves the features of this invention. Face 11 of the quartz is intentionally lapped and polished at a slightly different rotated Y-cut from that of face 13. Referring now to FIG. 5, such a substrate 50 is used to form an oscillator including pairs of ID transducers 52*a* and *b* and 54*a* and *b* deposited on faces 57 and 59 respectively. The pairs of transducers comprise a transmitting transducer and a receiving transducer and are cascaded through amplifier 55 to form the feedback path for amplifier 56, the main oscillator amplifier.

Figure 6:
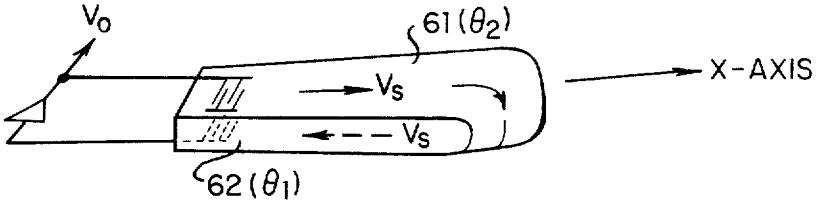
FIG. 6 is another embodiment of the present invention.

Another more difficult implementation would be to round the edges at one end so that a wave launched on one face can actually propagate around to the other face and be detected at the end as shown in FIG. 6. Faces 61 and 62 are cut at a different crystallographic orientation.

Figure 7:
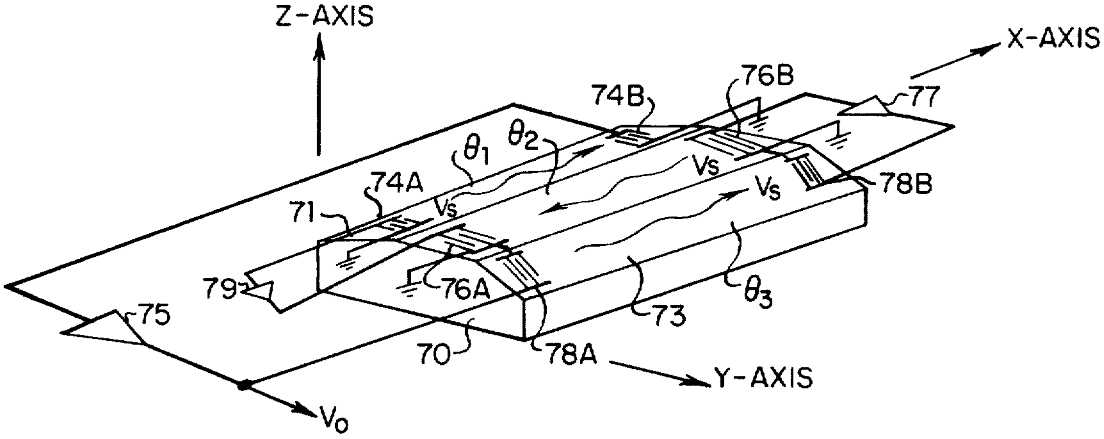
FIG. 7 is another embodiment of the present invention.

FIG. 7 shows a single multifaceted substrate 70 which extends the temperature range of the device. Here one side of the substrate has been faceted to form three surfaces 71, 72 and 73 at different rotated Y-cuts $\theta_1$, $\theta_2$ and $\theta_3$ respectively. Pairs of ID transducers 74*a* and *b*, 76*a* and *b*, and 78*a* and *b*, respectively, are deposited on each surface. Each transducer pair includes a transmitting and receiving transducer. These are then connected in cascade via amplifiers 77 and 79. The overall length of the delay line is therefore three times the length of the substrate. When the delay line is connected to amplifier 75 as shown, an oscillator having stable operation over a very broad temperature range results. In the limit, this surface is curved allowing the designer to select any set of angles to obtain stable performance over the broadest possible temperature range. It should be noted also that amplifiers 77 and 79 could be eliminated from this configuration if transducer 74*a* is connected to transducer 76*a* and transducer 76 *b* is connected to transducer 78*b*, and amplifier 75 provides sufficient loop gain.

Just as an ASW delay line constructed according to the present invention will exhibit constant phase shift between input and output over a broader temperature range, an ASW oscillator constructed according to this invention will provide a frequency-stable signal over a broader temperature range. In addition, for the embodiment shown in FIG. 7 wherein the effective length of the delay line is longer, the oscillator frequency is less susceptible to loop phase fluctuations.

We claim:

1. An acoustic surface wave delay line comprising:

a substrate of piezoelectric material having a plurality of surface regions of different crystallographic orientations;

at least one transmitting transducer disposed on one of the surface regions for propagating an acoustic surface wave having a first phase-shift response versus ambient temperature characteristic;

at least one receiving transducer disposed on another of the surface regions a predetermined distance from the transmitting transducer for receiving a propagated acoustic surface wave having a second phase-shift response versus ambient temperature characteristic; and coupling means coupled to the transmitting and receiving transducers for coupling the acoustic surface wave from one of the surface regions to another of the surface regions to provide at the receiving transducer an output signal having a phase-shift response versus ambient temperature characteristic equal to the combination of the first and second phase-shift response versus ambient temperature characteristics.

2. An acoustic surface wave delay line as in claim 1 wherein:

the plurality of surface regions includes a first and a last surface regions, and each of said plurality of surface regions having transmitting and receiving transducers disposed thereon for propagating acoustic surface waves, each of said waves having a phase-shift response versus ambient temperature characteristic;

the coupling means couple the receiving transducer on one surface region to the transmitting transducer on another surface region unless the receiving transducer is on the last surface region or unless the transmitting transducer is on the first surface region; and the output signal has a phase-shift response versus ambient temperature characteristic equal to the combination of all of the phase-shift response versus ambient temperature characteristics.

3. An acoustic surface wave delay line as in claim 1 wherein:

the substrate of piezoelectric material has first and second surface regions, the second surface region being cut at a different crystallographic orientation than the first surface region;

the transmitting transducer is disposed on the first surface region of the piezoelectric material;

the receiving transducer is disposed on the second surface region of the piezoelectric material;

the coupling means includes a receiving transducer disposed on the first surface region a predetermined distance from the transmitting transducer for receiving the acoustic surface wave therefrom, a transmitting transducer disposed on the second surface region a predetermined distance from the receiving transducer for transmitting the acoustic surface wave thereto, and a first amplifier having an input port connected to the receiving transducer on the first surface region and an output port connected to the transmitting transducer on the second surface region for coupling the acoustic surface wave from the first to second surface region.

4. An acoustic surface wave delay line as in claim 1 wherein the acoustic surface wave propagated on one of the surface regions also has a first frequency response versus ambient temperature characteristic, the acoustic surface wave propagated on another of the surface regions also has a second frequency response versus ambient temperature characteristic, and the output signal has a frequency response versus ambient temperature characteristic equal to the combination of the first and second frequency response versus ambient temperature characteristics; and further including a second amplifier having an input port connected to the receiving transducer and an output port connected to the transmitting transducer for producing at the output port of the second amplifier an oscillatory signal having a frequency response versus ambient temperature characteristic equal to the combination of the first and second frequency response versus ambient temperature characteristics.

* * * * *